United States Patent
Hwang et al.

(10) Patent No.: US 8,198,738 B1
(45) Date of Patent: Jun. 12, 2012

(54) STRUCTURE OF BOND PAD FOR SEMICONDUCTOR DIE AND METHOD THEREFOR

(75) Inventors: Chan Ha Hwang, Kyunggi-do (KR); Do Hyun Na, Seoul (KR); Chang Deok Lee, Kyunggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 216 days.

(21) Appl. No.: 11/873,229

(22) Filed: Oct. 16, 2007

(51) Int. Cl.
    *H01L 23/48* (2006.01)
(52) U.S. Cl. .............. 257/786; 257/784; 257/E23.021
(58) Field of Classification Search .............. 257/48, 257/786, 773, 798, E23.179, E21.522, E21.523, 257/E23.021
See application file for complete search history.

(56) References Cited

U.S. PATENT DOCUMENTS

| | | | |
|---|---|---|---|
| 6,242,935 B1* | 6/2001 | Akram | 324/765 |
| 6,348,742 B1* | 2/2002 | MacPherson | 257/786 |
| 6,563,226 B2* | 5/2003 | Harun et al. | 257/784 |
| 2002/0070450 A1* | 6/2002 | McKnight | 257/737 |
| 2004/0188763 A1* | 9/2004 | Taniguchi et al. | 257/355 |
| 2005/0121804 A1* | 6/2005 | Kuo et al. | 257/781 |
| 2007/0085221 A1* | 4/2007 | Tanabe | 257/782 |

* cited by examiner

*Primary Examiner* — Marcos D Pizarro Crespo
*Assistant Examiner* — Sarah Salerno
(74) *Attorney, Agent, or Firm* — Weiss & Moy, P.C.; Jeffrey D. Moy

(57) ABSTRACT

A bond pad and a method of making the same for a semiconductor die has a bonding region formed on the bond pad. A test region is formed on the bond pad and is adjacent to the bonding region.

23 Claims, 5 Drawing Sheets

STRUCTURE OF BOND PAD FOR SEMICONDUCTOR DIE AND METHOD THEREFOR

FIELD OF THE INVENTION

The present invention relates generally to a semiconductor device and, more specifically, to a structure of a bond pad for a semiconductor die.

DESCRIPTION OF THE RELATED ART

Generally, a semiconductor wafer includes a plurality of semiconductor dies arranged in a matrix. Further, each of the semiconductor dies has a plurality of bond pads for electrically connecting the semiconductor die to conductive wires or conductive bumps.

After the semiconductor wafer having the above-described structure has been manufactured, each of the semiconductor dies is electrically tested. For example, a test device causes probes to come into contact with bond pads formed on the semiconductor die. Thereafter, the test device applies a desired voltage or current to the bond pads through the probes in order to detect if the semiconductor dies have any problems. In this case, so-called probe marks which appear in the form of grooves and undesired sources of contamination may be formed on the bond pad on each of the semiconductor dies. And, since the above-described test may be performed for a plurality of times, there are problems in that a plurality of probe marks may be formed on one bond pad and serious contamination may occur.

On the other hand, as semiconductors have been highly integrated and the sizes thereof have become small, the sizes of semiconductor dies and bond pads formed thereon have also become small. Therefore, the sizes of each of conductive wires or conductive bumps to be bonded on the bond pad during a packaging process have become small as well.

However, since each of the probes of the test device should exactly contact with each of the bond pads, it is difficult to reduce the size of the bond pads. That is, when the size of the bond pad and a bonding region formed therein becomes small, the probe mark relatively becomes large.

The probe mark causes the bond strength of the conductive wire or the conductive bump to reduce and raises a lift ratio of the conductive wire or the conductive bump. That is, the probe mark functions as a source of contamination so that the conductive wire or the conductive bump weakly bonds to the corresponding bond pad and the conductive wire or the conductive bump is easily separated from the bond pads after a bonding process. And, being compared with the size of the bonding region, if the size of the probe mark is large, the lift ratio increases.

Therefore, a need exists to provide a structure and method to overcome the above problems.

SUMMARY OF THE INVENTION

A bond pad and a method of making the same for a semiconductor die has a bonding region formed on the bond pad. A test region is formed on the bond pad and is adjacent to the bonding region.

The present invention will be more apparent from the following detailed description taken in conjunction with the accompanying drawings.

BRIEF SUMMARY OF THE INVENTION

Figure 1A:
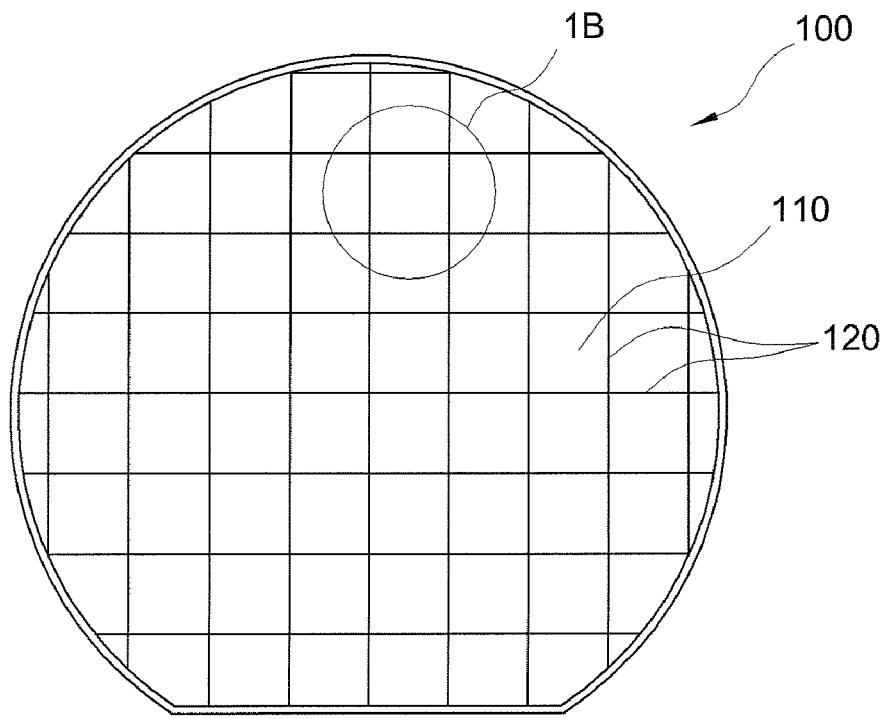
Figure 1B:
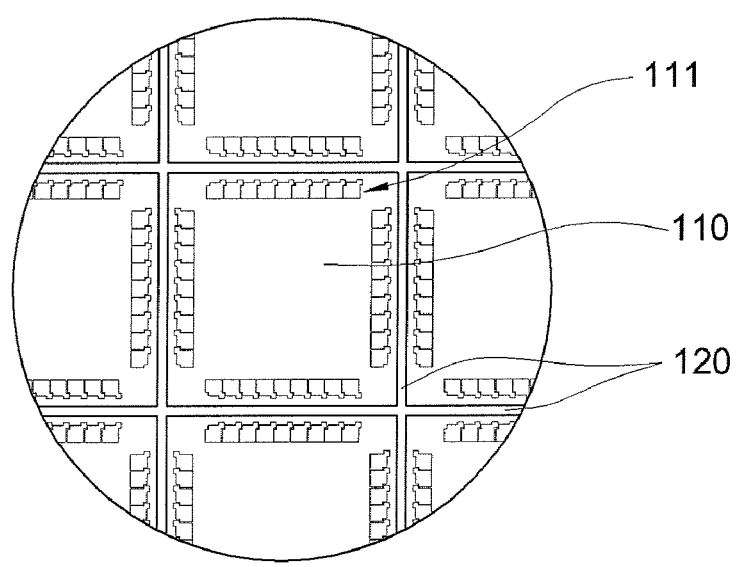
Figure 2:
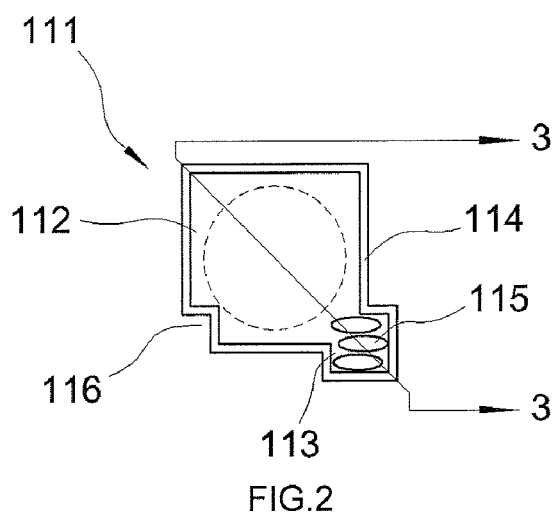
Figure 3A:
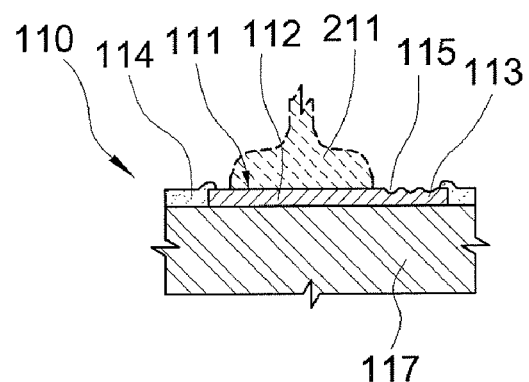
Figure 3B:
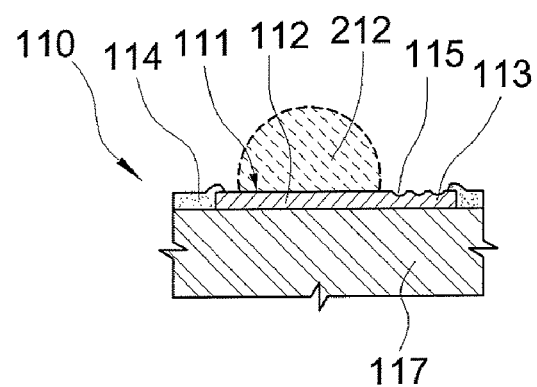
Figure 4:
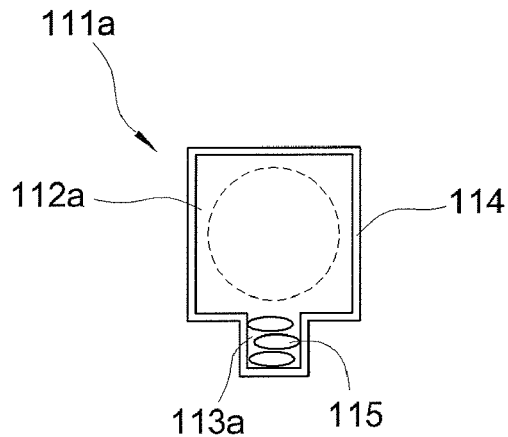
Figure 5A:
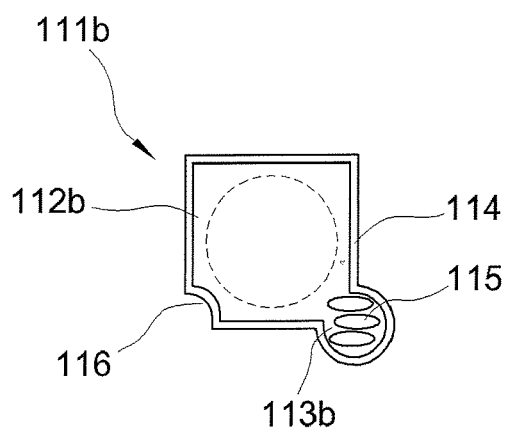
Figure 5B:
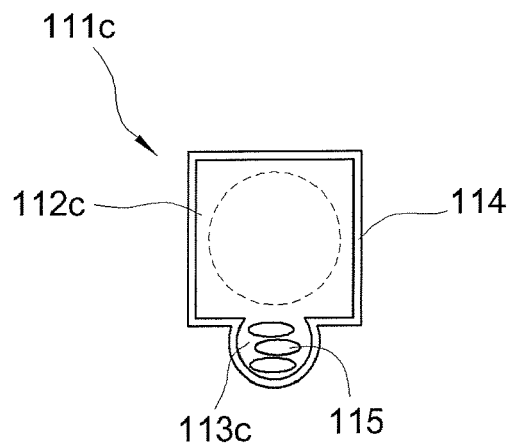
Figure 6A:
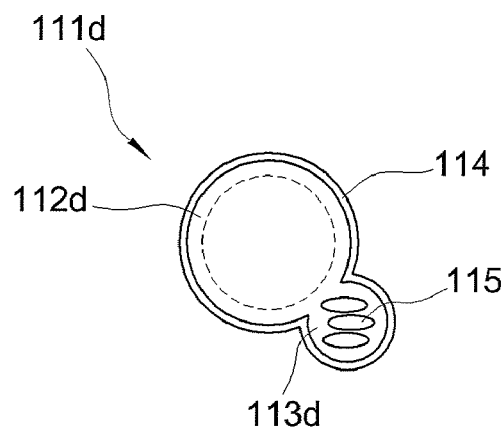
Figure 6B:
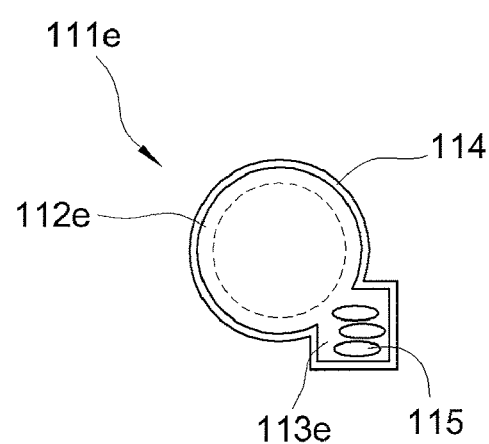

FIG. 1A is a plan view illustrating a semiconductor wafer;
FIG. 1B is a plan view in which a region 1B shown in FIG. 1A is enlarged;
FIG. 2 is a plan view illustrating a structure of a bond pad for a semiconductor die according to one embodiment of the present invention;
FIG. 3A is a cross-sectional view of a conductive wire taking along 3-3 of FIG. 2;
FIG. 3B is a cross-sectional view showing a conductive bump taking along 3-3 of FIG. 2;
FIG. 4 is a plan view illustrating a structure of a bond pad for a semiconductor die according to another embodiment of the invention;
FIG. 5A is a plan view illustrating a structure of a bond pad for a semiconductor die according to another embodiment of the invention;
FIG. 5B is a plan view illustrating a structure of a bond pad for a semiconductor die according to another embodiment of the invention;
FIG. 6A is a plan view illustrating a structure of a bond pad for a semiconductor die according to another embodiment of the invention;
FIG. 6B is a plan view illustrating a structure of a bond pad for a semiconductor die according to another embodiment of the invention;
FIG. 7 is a plan view illustrating a structure of a bond pad for a semiconductor die according to another embodiment of the invention;
FIG. 8A is a plan view illustrating a structure of a bond pad for a semiconductor die according to another embodiment of the invention; and
FIG. 8B is a plan view illustrating a structure of a bond pad for a semiconductor die according to another embodiment of the invention.

Common reference numerals are used throughout the drawings and the detailed description to indicate like elements.

DETAILED DESCRIPTION OF THE INVENTION

As shown in FIG. 1A, a semiconductor wafer 100 has an approximately disc shape wherein one side thereof has scribe lines 120 formed thereon. A plurality of semiconductor dies 110 are arranged on the semiconductor wafer 100 in the vertical and horizontal directions based on the scribe lines 120. That is, the plurality of semiconductor dies 110 is arranged in a matrix or in a grid pattern on the semiconductor wafer 100.

As shown in FIG. 1B, the semiconductor die 110 is defined by the scribe line 120 to have an approximately square or rectangular shape. A plurality of bond pads 111 is formed on a surface of the semiconductor die 110. Each of the bond pads 111 may be formed adjacent to the scribe line 120 in an approximately linear manner. Alternatively, the bond pad 111 may be formed adjacent to the scribe line 120 in two or three lines. The bond pad 111 may also be formed in approximately one or more lines on the center of the semiconductor die 110. The position in which the bond pad 111 is formed may vary according to design conditions for the semiconductor die 110 and the invention is not limited thereto.

Referring now to FIG. 2, the bond pad 111 of the semiconductor die 110 according to one embodiment of the invention is shown. The bond pad 111 includes a bonding region 112 to which a conductive wire or a conductive bump are bonded during a semiconductor package manufacturing process and a test region 113 to be used as a probe mark surface. Thus, when a probe comes in contact with the test region 113, a probe mark 115 is formed on the test region 113 during a semiconductor test process. The bonding region 112 is adjacent and connected to the test region 113 and the bonding region 112 has a surface area larger than a surface area of the test region 113. However, the bonding region 112 may be smaller than the test region 113. The bonding region 112 and the test region 113 may be formed by aluminum (Al) or any other similar conductive material but the invention is not limited thereto. Further, both the bonding region 112 and the test region 113 are surrounded by an insulative protection layer 114 having predetermined thickness.

The bonding region 112 of the bond pad 111 has an approximately rectangular shape in a plan view. That is, the bonding region 112 has an approximately rectangular shape in which a dent region 116 is formed in one corner of the bonding region 112 and the test region 113 is formed in another corner of the bonding region 112. Here, the dent region 116 is formed to prevent the test region 113 from interfering with the bond pad 111 when a plurality of bond pads 111 is adjacently arranged to each other. Therefore, when the bond pads 111 are formed to be sufficiently separated from each other and the test regions 113 thereof do not interfere with other bond pads 111, the dent region 116 may not be formed. Further, a conductive wire or a conductive bump is bonded to the bonding region 112 during the semiconductor packaging process. The conductive wire or the conductive bump is bonded to a region indicated by a dotted circle in FIG. 2.

The test region 113 of the bond pad 111 has an approximately rectangular shape. One corner of the test region 113 is connected to one corner of the bonding region 112. A probe comes into contact with a surface of the test region 113 during the semiconductor test process so that a probe mark 115 having a predetermined thickness is formed on the surface of the test region 113. The probe mark 115 has an approximately ellipse shape in a plan view and the thickness thereof is not regular.

According to the present embodiment of the invention, the bond pad 111 includes the bonding region 112 to which the conductive wire or the conductive bump is bonded and the test region 113 with which the test probe comes into contact. Therefore, it is possible to prevent bond strength of the conductive wire or the conductive bump from being reduced due to the probe mark 115. Accordingly, the lift ratio of the conductive wire or the conductive bump becomes low. That is, the probe mark 115 which functions as a source of contamination with respect to the conductive wire or the conductive bump is formed on the test region 113 other than the bonding region 112. Therefore, it is possible to improve bond strength of the conductive wire or the conductive bump and to reduce the lift ratio thereof.

FIGS. 3A and 3B are cross-sectional views taking along 3-3 of FIG. 2. Here, a dotted line shown in FIG. 3A indicates a bonding shape of the conductive wire 211 and a dotted line shown in FIG. 3B indicates a bonding shape of the conductive bump 212.

As shown in FIGS. 3A and 3B, the semiconductor die 110 includes a semiconductor substrate 117 on which an active region (not shown) is formed, a bond pad 111 which is formed on a surface of the semiconductor substrate 117 and electrically connected to the active region, and an insulative protection layer 114 for enclosing the bond pad 111.

Further, as described above, the bond pad 111 includes the bonding region 112 and the test region 113. The conductive wire 211 may bond to the bonding region 112 as shown in FIG. 3A or the conductive bump 212 may bond to the bonding region 112 as shown in FIG. 3B. The probe mark 115 having a predetermined thickness may be formed on the test region 113. If the conductive wire 211 or the conductive bump 212 is bonded to the probe mark 115, the bond strength becomes very weak and the lift ratio becomes high. However, as described above, according to the embodiment of the invention, since the bond pad 111 includes the bonding region 112 and the test region 113, respectively, and the conductive wire 211 or the conductive bump 212 is bonded to the bonding region 112, it is possible to improve the bond strength and to reduce the lift ratio.

Referring now to FIG. 4, a bond pad 111a of a semiconductor die according to another embodiment of the invention is shown. The bond pad 111a includes a bonding region 112a which has an approximately square shape and a test region 113a which is connected to the bonding region 112a and has an approximately square shape. Further, a protection layer 114 covers circumferences of the bonding region 112a and the test region 113a.

In particular, the bonding region 112a has a square shape having four edges and four sides. Further, the test region 113a has a square shape having four edges and four sides. Furthermore, one side of the test region 113a is connected to one side of the bonding region 112a. In this embodiment, the test region 113a extends from a lower central area of the bonding region 112a. In addition, the size of the bonding region 112a may be larger than that of the test region 113a or the size of the test region 113a may be larger than that of the bonding region 112a.

Referring now to FIG. 5A, a bond pad 111b of a semiconductor die according to another embodiment of the invention is shown. The bond pad 111b includes a bonding region 112b which has an approximately square shape and a test region 113b which is connected to the bonding region 112b and has an approximately circular shape. In this embodiment, the test region 113b extends from a lower corner of the bonding region 112b. Further, both the bonding region 112b and the test region 113b are surrounded by a protection layer 114. In particular, the bonding region 112b has an approximately square shape having a dent region 116 formed in one corner area thereof. Further, the test region 113b has an approximately circular shape and is connected to a lower corner area of the bonding region 112b. The dent region 116 is formed to prevent the test region 113b from interfering with the bond pad 111a when a plurality of bond pads 111a is adjacently arranged to each other.

As shown in FIG. 5B, a bond pad 111c of a semiconductor die according to another embodiment of the invention is shown. The bond pad 111c includes a bonding region 112c which has an approximately square shape and a test region 113c which is connected to the bonding region 112c and has an approximately circular shape. In particular, the bonding region 112c has an approximately square shape. Further, the test region 113c has an approximately circular shape and is connected to one side of the bonding region 112c.

As shown in FIG. 6A, a bond pad 111d of a semiconductor die according to another embodiment of the present invention is shown. The bond pad 111d includes a bonding region 112d which has an approximately circular shape, and a test region 113d which is connected to the bonding region 112d and has an approximately circular shape. In particular, the bonding region 112d has an approximately circular shape having a predetermined radius. Further, the test region 113d has an approximately circular shape having a predetermined radius and is connected to the bonding region 112d peripheral.

As shown in FIG. 6B, a bond pad 111e of a semiconductor die according to another embodiment of the present invention is shown. The bond pad 111e includes a bonding region 112e which has an approximately circular shape and a test region 113e which is connected to the bonding region 112e and has an approximately square shape. In particular, the bonding region 112e has an approximately circular shape having a predetermined radius. Further, the test region 113e has an approximately square shape and is connected to the bonding region 112e peripheral.

Figure 7A:
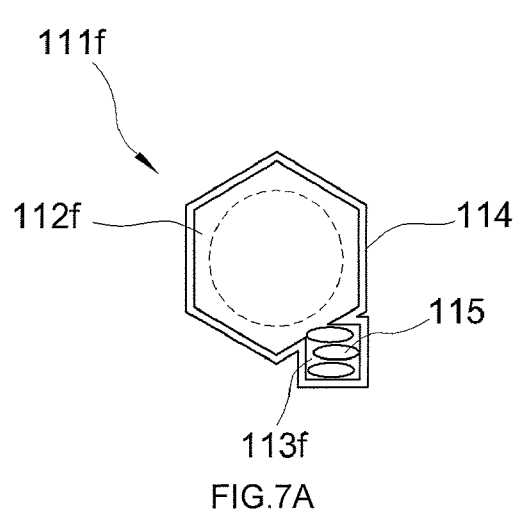
Figure 8A:
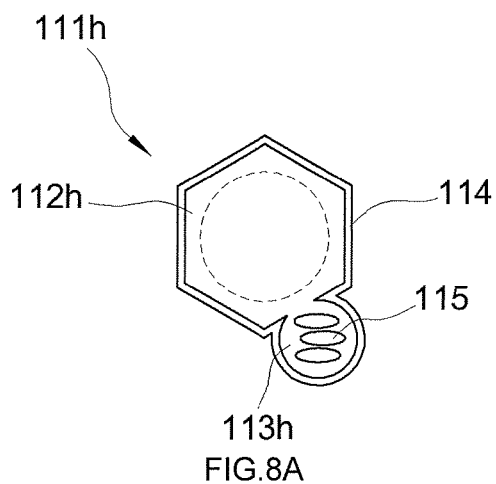
Figure 8B:
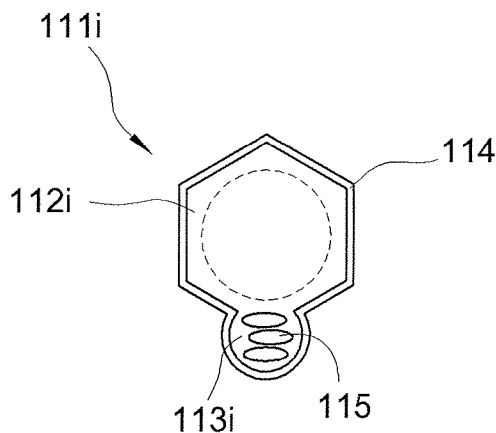

As shown in FIG. 7A, a bond pad 111f according to another embodiment of the present invention is shown. The bond pad 111f includes a bonding region 112f which has an approximately hexagonal shape and a test region 113f which is connected to the bonding region 112f and has an approximately square shape. In particular, the bonding region 112f has an approximately hexagonal shape having six edges and six sides. Further, the test region 113f has an approximately square shape and is connected to one circumference of the bonding region 112f.

Figure 7B:
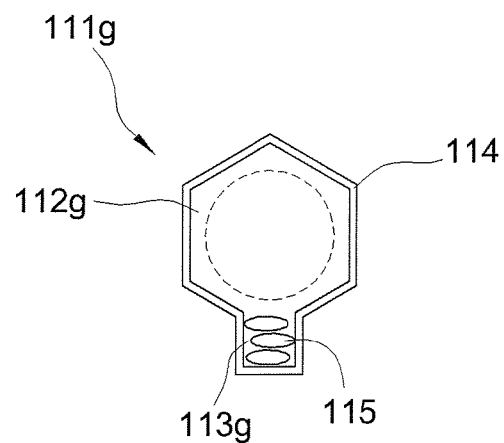

As shown in FIG. 7B, a bond pad 111g of a semiconductor die according to another exemplary embodiment of the invention includes a bonding region 112g which has an approximately hexagonal shape and a test region 113g which is connected to the bonding region 112g and has an approximately square shape. In particular, the bonding region 112g has an approximately hexagonal shape having six edges and six sides. Further, the test region 113g has an approximately square shape and is connected to one corner of the bonding region 112g.

As shown in FIG. 8A, a bond pad 111h of a semiconductor die according to another embodiment of the invention includes a bonding region 112h which has an approximately hexagonal shape and a test region 113h which is connected to the bonding region 112h and has an approximately circular shape. In particular, the bonding region 112h has an approximately hexagonal shape having six edges and six sides. Further, the test region 113h has an approximately circular shape and is connected to one circumference of the bonding region 112h.

As shown in FIG. 8B, a bond pad 111i of a semiconductor die according to another exemplary embodiment of the invention includes a bonding region 112i which has an approximately hexagonal shape and a test region 113i which has an approximately circular shape. That is, the bonding region 112i has an approximately hexagonal shape having six edges and six sides. Further, the test region 113i has an approximately circular shape and is connected to one corner of the bonding region 112i.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A bond pad area for a semiconductor die comprising:
   a plurality of bonding pads, wherein each bonding pad comprises:
   a bonding region formed on the bond pad;
   a test region formed on the bond pad, the test region formed adjacent to the bonding region, the test region allowing for a probe mark to be formed thereon; and
   an indented region formed on a side of the bond pad opposite of the test region to prevent the test region of the bond pad from interfering with a test region from a neighboring bond pad;
   wherein each test region of each bond pad on a first side of the semiconductor die are aligned in a first row and wherein each bonding region of each bond pad on the first side of the semiconductor die are aligned in a second row, wherein the first row and the second row are approximately parallel.

2. A bond pad for a semiconductor die in accordance with claim 1, wherein the bonding region and the test region are formed of a similar conductive material.

3. A bond pad for a semiconductor die in accordance with claim 1, wherein the bonding region has an area larger than an area of the test region.

4. A bond pad for a semiconductor die in accordance with claim 1, wherein both the bonding region and test region have a generally rectangular shape.

5. A bond pad for a semiconductor die in accordance with claim 4, wherein a corner area of the test region is connected to a corner area of the bonding region.

6. A bond pad for a semiconductor die in accordance with claim 5 further comprising an insulative protection layer formed around a perimeter of the bond pad for enclosing the bond pad.

7. A bond pad for a semiconductor die in accordance with claim 1, wherein the bonding region has a generally rectangular shape and the test region has a generally circular shape.

8. A bond pad for a semiconductor die in accordance with claim 7, wherein the test region is connected to a corner of the bonding region.

9. A bond pad for a semiconductor die in accordance with claim 8 further comprising means for preventing interfering with the bond pad from a neighboring bond pad.

10. A bond pad for a semiconductor die in accordance claim 1, wherein the bonding region and the test region have a generally circular shape.

11. A bond pad for a semiconductor die in accordance with claim 1, wherein the bonding region has a generally circular shape and the test region has a generally rectangular shape.

12. A bond pad for a semiconductor die in accordance with claim 1, wherein the bonding region has a generally hexagonal shape and the test region has a generally square shape.

13. A bond pad for a semiconductor die in accordance wherein the bonding region has a generally hexagonal shape and the test region has a generally circular shape.

14. A bond pad area for a semiconductor die comprising:
    a plurality of bond pads, wherein each bond pad comprises:
    a bonding region formed on the bond pad;
    means for testing the semiconductor die formed adjacent to the bonding region and for allowing a probe mark to be formed thereon; and
    an indented region formed on a side of the bond pad opposite of the test region to prevent the test region of the bond pad from interfering with a test region from a neighboring bond pad;
    wherein the means for testing of each bond pad on a first side of the semiconductor die are aligned in a first row and wherein the bonding region of each bond pad on the first side of the semiconductor die are aligned in a second row.

15. A bond pad for a semiconductor die in accordance with claim 14, wherein the bonding region and the means for testing are formed of a similar conductive material.

16. A bond pad for a semiconductor die in accordance with claim 14, wherein the bonding region has an area larger than an area of the means for testing.

17. A semiconductor die comprising a plurality of bond pads, each bond pad comprising:
    a bonding region for receiving a conductive interconnect;
    a test region, adjacent to the bonding region, for receiving a test probe, the test region allowing for a probe mark to be formed thereon by the test probe; and an indented region formed on a side of the bond pad opposite of the test region to prevent the test region of the bond pad from interfering with a test region from a neighboring bond pad;

wherein the test region of each bond pad on a first side of the semiconductor die are aligned in a row.

18. A semiconductor die in accordance with claim 17, wherein the conductive interconnect is a wirebond.

19. A semiconductor die in accordance with claim 17, wherein the conductive interconnect is a bump.

20. A semiconductor die in accordance with claim 17, wherein the bonding region and the test region are formed of a similar conductive material.

21. A bond pad for a semiconductor die in accordance with claim 1, wherein the bonding region, the test region and the indent region are formed on a first surface of a substrate.

22. A bond pad for a semiconductor die in accordance with claim 14 wherein the bonding region, means for testing, and the indented region are formed on a first surface of the substrate.

23. A semiconductor die in accordance with claim 17 wherein the semiconductor die further comprising a substrate, the bonding region, the test region, and the indented region formed on a first surface of the substrate.

* * * * *